United States Patent
Kim et al.

(10) Patent No.: US 8,729,552 B2
(45) Date of Patent: May 20, 2014

(54) BACKPLANE FOR FLAT PANEL DISPLAY APPARATUS, FLAT PANEL DISPLAY APPARATUS INCLUDING THE SAME, AND METHOD OF MANUFACTURING BACKPLANE FOR FLAT PANEL DISPLAY APPARATUS

(75) Inventors: Kwang-Suk Kim, Yongin (KR); Min-Kyu Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/494,414

(22) Filed: Jun. 12, 2012

(65) Prior Publication Data
US 2013/0001577 A1 Jan. 3, 2013

(30) Foreign Application Priority Data
Jun. 29, 2011 (KR) .................. 10-2011-0064078

(51) Int. Cl.
*H01L 29/12* (2006.01)

(52) U.S. Cl.
USPC .............................. 257/71; 438/23

(58) Field of Classification Search
USPC ........................................................ 257/71
See application file for complete search history.

(56) References Cited

U.S. PATENT DOCUMENTS

| | | | |
|---|---|---|---|
| 5,614,729 | A | 3/1997 | Ukai et al. |
| 7,336,324 | B2 | 2/2008 | Kim et al. |
| 2007/0238217 | A1* | 10/2007 | Shih ............................ 438/69 |
| 2008/0274610 | A1 | 11/2008 | Choi et al. |
| 2009/0121234 | A1 | 5/2009 | Jeon et al. |
| 2009/0135102 | A1* | 5/2009 | Park ................ 345/76 |
| 2010/0006834 | A1* | 1/2010 | Kim et al. ........... 257/43 |
| 2011/0114960 | A1* | 5/2011 | Lee et al. ........... 257/71 |
| 2012/0074414 | A1* | 3/2012 | Lee et al. ........... 257/59 |

FOREIGN PATENT DOCUMENTS

| | | |
|---|---|---|
| JP | 8-78699 A | 3/1996 |
| KR | 10-2005-0054316 A | 6/2005 |
| KR | 10-2008-0097821 A | 11/2008 |
| KR | 10-2009-0049866 A | 5/2009 |

OTHER PUBLICATIONS

Onishi et. al., "Effects of Nd content in Al thin films on hillock formation". J. Vac. Sci. Technol. A 15 , 2339 (1997).*

* cited by examiner

*Primary Examiner* — Thao Le
*Assistant Examiner* — Laura Dykes
(74) *Attorney, Agent, or Firm* — Knobbe Martens Olson & Bear LLP

(57) ABSTRACT

In one aspect, a back plane for a flat panel display apparatus include: a substrate; a source electrode and a drain electrode formed on the substrate; a capacitor bottom electrode formed on a same layer as the source/drain electrodes; an active layer formed on the substrate in correspondence to the source electrode and the drain electrode; a blocking layer interposed between the source electrode and the drain electrode and the active layer; a first insulation layer formed on the substrate to cover the active layer; a gate electrode formed on the first insulation layer in correspondence to the active layer; a capacitor top electrode formed on a same layer as the gate electrode in correspondence to the capacitor bottom electrode; and a second insulation layer formed on the first insulation layer to cover the gate electrode and the capacitor top electrode is provided.

17 Claims, 11 Drawing Sheets

BACKPLANE FOR FLAT PANEL DISPLAY APPARATUS, FLAT PANEL DISPLAY APPARATUS INCLUDING THE SAME, AND METHOD OF MANUFACTURING BACKPLANE FOR FLAT PANEL DISPLAY APPARATUS

CROSS-REFERENCE TO RELATED APPLICATION

This application claims the benefit of Korean Patent Application No. 10-2011-0064078 filed in the Korean Intellectual Property Office on Jun. 29, 2011, the disclosure of which is incorporated herein by reference in its entirety.

BACKGROUND

1. Field

The present disclosure relates to a backplane for a flat panel display apparatus, a flat panel display apparatus including the same, and a method of manufacturing the backplane for a flat panel display apparatus.

2. Description of the Related Technology

A flat panel display apparatus, such as an organic light emitting display apparatus or a liquid crystal display apparatus, is manufactured on a substrate having formed thereon a pattern including at least one thin-film transistor (TFT), at least one capacitor, and wires interconnecting the same for driving the flat panel display apparatus. Here, the TFT includes an active layer which provides a channel region, a source region, and a drain region and a gate electrode which is formed on the channel region and is electrically insulated from the active layer by a gate insulation layer.

SUMMARY

One or more aspects of the present embodiments provides a back plane for a flat panel display apparatus, which is capable of preventing metal diffusion from source/drain electrodes to an active layer, a flat panel display apparatus including the same, and a method of manufacturing the back plane for a flat panel display apparatus.

According to an aspect of the present embodiments, there is provided a back plane for a flat panel display apparatus, the back plane including: a substrate; a source electrode and a drain electrode formed on the substrate; a capacitor bottom electrode formed on a same layer as the source/drain electrodes; an active layer formed on the substrate in correspondence to the source electrode and the drain electrode; a blocking layer interposed between the source electrode and the drain electrode and the active layer; a first insulation layer formed on the substrate to cover the active layer; a gate electrode formed on the first insulation layer in correspondence to the active layer; a capacitor top electrode formed on a same layer as the gate electrode in correspondence to the capacitor bottom electrode; and a second insulation layer formed on the first insulation layer to cover the gate electrode and the capacitor top electrode.

In some embodiments, the back plane for a flat panel display apparatus may further include a buffer layer interposed between the substrate and the source electrode and the drain electrode.

In some embodiments, the active layer may contain an oxide semiconductor.

In some embodiments, the active layer may contain at least one material selected from the group consisting of indium (In), gallium (Ga), tin (Sn), zirconium (Zr), vanadium (V), hafnium (Hf), cadmium (Cd), germanium (Ge), and zinc (Zn).

In some embodiments, the source electrode and the drain electrode may include first layers, second layers, and third layers that are formed on the substrate in the order stated, and the second layers may be formed of a metal with less electric resistance as compared to the first and third layers.

In some embodiments, the second layers may be formed of aluminum (Al), copper (Cu), or an aluminum alloy.

In some embodiments, the active layer may overlap at least portions of the top surfaces of the source electrode and the drain electrode.

In some embodiments, the blocking layer may be interposed between the source electrode and the drain electrode and the active layer to prevent the active layer from directly contacting the source electrode and the drain electrode.

In some embodiments, the blocking layer may prevent a metal constituting the second layers from diffusing toward the active layer.

In some embodiments, the blocking layer may be formed of a gallium oxide, an aluminum oxide, a titanium oxide, or a tungsten oxide.

According to another aspect of the present embodiments, there is provided a flat panel display apparatus including: the back plane for a flat panel display apparatus; a pixel electrode which is formed on the second insulation layer and is electrically connected to the source electrode or the drain electrode; an intermediate layer which is formed on the pixel electrode and comprises an emissive layer; and a counter electrode which is formed to face the pixel electrode across the intermediate layer.

In some embodiments, the flat panel display apparatus may further include a third insulation layer which is formed on the second insulation layer to cover end portions of the pixel electrode and may include an opening for exposing at least a portion of the pixel electrode.

According to another aspect of the present embodiments, there is provided a flat panel display apparatus including: the back plane for a flat panel display apparatus; a pixel electrode which is formed on the substrate on a same layer as the source electrode and the drain electrode and is electrically connected to the source electrode or the drain electrode; an intermediate layer which is formed on the pixel electrode and comprises an emissive layer; and a counter electrode which is formed to face the pixel electrode across the intermediate layer.

In some embodiments, the first insulation layer may include a first opening which exposes at least a portion of the pixel electrode, and the second insulation layer may include a second opening which is formed adjacent to the first opening or inside the first opening to expose at least a portion of the pixel electrode.

In some embodiments, the source electrode and the drain electrode may include first layers, second layers, and third layers that are formed on the substrate in the order stated, the first layers may contain a metal oxide, the second layers may be formed of a metal with less electric resistance as compared to the first and third layers, the pixel electrode may include a first conductive layer, a second conductive layer, and a third conductive layer that are formed on the substrate in the order stated, the first conductive layer may contain a metal oxide, and the second and third conductive layers may include openings for exposing the first conductive layer.

In some embodiments, the second layers may be formed of aluminum (Al), copper (Cu), or an aluminum alloy.

In some embodiments, the counter electrodes may reflect light emitted by the emissive layer.

According to another aspect of the present embodiments, there is provided a method of manufacturing a back plane for a flat panel display apparatus, the method including: a first masking operation for forming a source electrode, a drain electrode, and a capacitor bottom electrode on a substrate; a second masking operation for forming a blocking layer contacting the source electrode and the drain electrode and an active layer formed on the blocking layer; forming a first insulation layer on the substrate to cover the active layer; forming a gate electrode on the first insulation layer in correspondence to the active layer; a third masking operation for forming a capacitor top electrode on a same layer as the gate electrode in correspondence to the capacitor bottom electrode; and forming a second insulation layer on the first insulation layer to cover the gate electrode and the capacitor top electrode.

In some embodiments, the active layer may contain an oxide semiconductor.

In some embodiments, the active layer may contain at least one material selected from the group consisting of indium (In), gallium (Ga), tin (Sn), zirconium (Zr), vanadium (V), hafnium (Hf), cadmium (Cd), germanium (Ge), and zinc (Zn).

In some embodiments, the source electrode and the drain electrode may include first layers, second layers, and third layers that are formed on the substrate in the order stated, and the second layers may be formed of a metal with less electric resistance as compared to the first and third layers.

In some embodiments, the second layers may be formed of aluminum (Al), copper (Cu), or an aluminum alloy.

In some embodiments, the active layer may overlap at least portions of the top surfaces of the source electrode and the drain electrode.

In some embodiments, the blocking layer may be formed by forming a gallium layer, an aluminum layer, a titanium layer, or a tungsten layer on the source electrode and the drain electrode and oxidizing the gallium layer, the aluminum layer, the titanium layer, or the tungsten layer.

In some embodiments, the first masking operation may further include forming a pixel electrode on the substrate on a same layer as the source electrode and the drain electrode to be electrically connected to the source electrode or the drain electrode.

In some embodiments, the source electrode and the drain electrode may include first layers, second layers, and third layers that are formed on the substrate in the order stated, the first layers may contain a metal oxide, the second layers may be formed of a metal with less electric resistance as compared to the first and third layers, the pixel electrode may include a first conductive layer, a second conductive layer, and a third conductive layer that are formed on the substrate in the order stated, and the first conductive layer may contain a metal oxide.

In some embodiments, the method may further include a third-first masking operation for forming a first opening, which exposes the third conductive layer, in the first insulation layer before the third masking operation.

In some embodiments, the third masking operation may include: forming a metal layer to cover the third conductive layer of the exposed pixel electrode; and forming the gate electrode and the capacitor top electrode by patterning the metal layer and exposing the first conductive layer of the pixel electrode by removing the second conductive layer and the third conductive layer of the exposed pixel electrode.

In some embodiments, the method may further include a fourth masking operation for forming a second opening which is formed adjacent to the first opening or inside the first opening to expose the first conductive layer of the pixel electrode.

According to another aspect of the present embodiments, there is provided a method of manufacturing a flat panel display apparatus, the method including: a first masking operation for forming a source electrode, a drain electrode, and a capacitor bottom electrode on a substrate; a second masking operation for forming a blocking layer contacting the source electrode and the drain electrode and an active layer formed on the blocking layer; forming a first insulation layer on the substrate to cover the active layer; a third masking operation for forming a gate electrode on the first insulation layer in correspondence to the active layer and forming a capacitor top electrode on a same layer as the gate electrode in correspondence to the capacitor bottom electrode; forming a second insulation layer on the first insulation layer to cover the gate electrode and the capacitor top electrode; a fourth masking operation for forming a via hole which penetrates through the first insulation layer and the second insulation layer and expose the source electrode or the drain electrode; a fifth masking operation for forming a pixel electrode on the second insulation layer to be electrically connected to the source electrode or the drain electrode via the via hole; forming an intermediate layer, which comprises an emissive layer, on the pixel electrode; and forming a counter electrode which faces the pixel electrode across the intermediate layer.

In some embodiments, the method may further include a sixth masking operation for forming a third insulation layer which covers end portions of the pixel electrode and comprises an opening for exposing at least a portion of the pixel electrode.

BRIEF DESCRIPTION OF THE DRAWINGS

The above and other features and advantages of the present embodiments will become more apparent by describing in detail exemplary embodiments thereof with reference to the attached drawings where like references numbers indicate identical or functionally similar elements.

DETAILED DESCRIPTION

Figure 1:
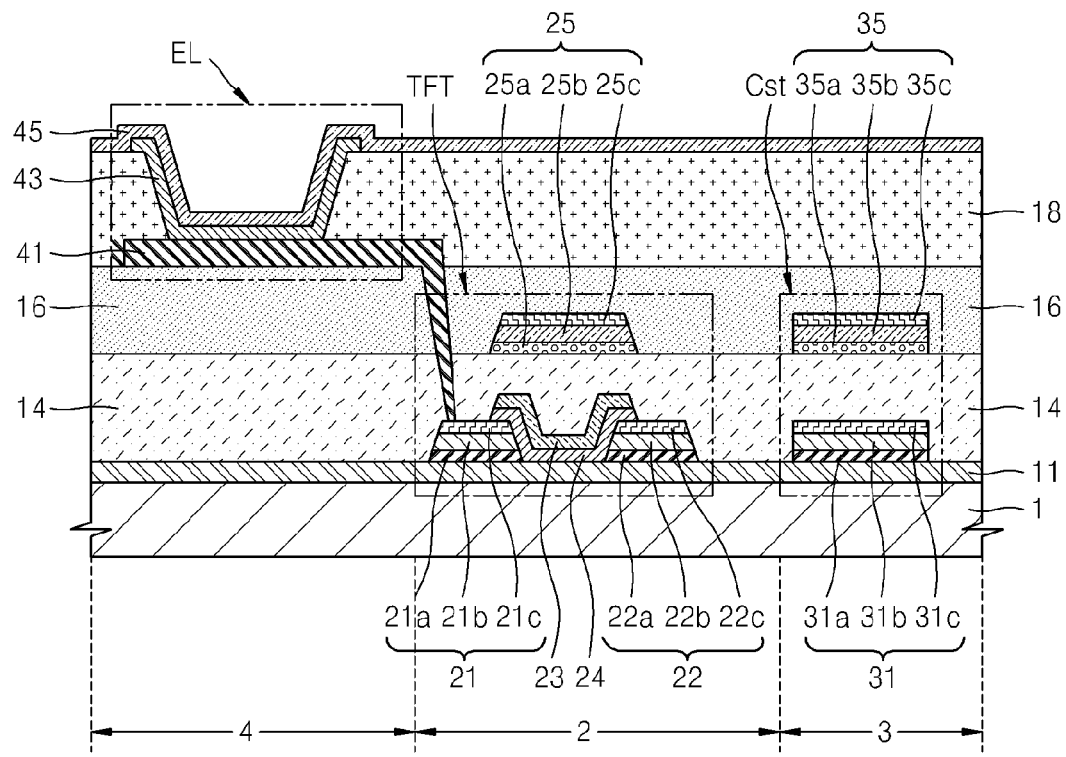
FIG. 1 is a schematic sectional view of a back plane for a flat panel display apparatus according to an aspect of the present embodiments.

FIG. 1 is a schematic sectional view of a back plane for a flat panel display apparatus according to an aspect of the present embodiments.

Referring to FIG. 1, the back plane for a flat panel display apparatus includes a transistor region 2, a storage region 3, and an emissive region 4.

The transistor region 2 includes a thin-film transistor (TFT) as a driving device. The TFT includes an active layer 23, a blocking layer 24, a gate electrode 25, and the source electrode 22 and the drain electrode 21. A TFT according to an aspect of the present embodiment may be a top-gate type TFT in which the gate electrode 25 is arranged above the active layer 23 and a bottom-contact type in which the source electrode 22 and the drain electrode 21 contact a bottom surface of the active layer 23. Furthermore, in some embodiments TFT may be an oxide semiconductor TFT in which the active layer 23 contains an oxide semiconductor.

In some embodiments, the source electrode 22 and the drain electrode 21 of the TFT may be formed on a buffer layer 11 that is formed on a substrate 1. The source electrode 22 and the drain electrode 21 may include at least first layers 21a and 22a, second layers 21b and 22b, and third layers 21c and 22c that are stacked from the substrate 1 in the order stated. In some embodiments, the second layers 21b and 22b may be formed of a metal with low electric resistance. For example, the second layers 21b and 22b may be formed of aluminum (Al), copper (Cu), or an aluminum alloy. Examples of aluminum alloys include, but are not limited to, AlNd, AlNiLa, AlGeCoLa, AlNiGeLa, and the like. In some embodiments, the third layers 21c and 22c and the first layers 21a and 22a may be arranged on and below the second layers 21b and 22b. The first layers 21a and 22a function as an anti-diffusion layer for preventing diffusion of the second layers 21b and 22b, whereas the third layers 21c and 22c may function as a capping layer for preventing hillock. In some embodiments, the third layers 21c and 22c and the first layers 21a and 22a may be formed of Ti, Mo, TiN, TiSiN, TiAlN, and the like.

The blocking layer 24 and the active layer 23 are formed on the source electrode 22 and the drain electrode 21. In other words, the blocking layer 24 is interposed between the source electrode 22 and the drain electrode 21 and the active layer 23 to prevent the source electrode 22 and the drain electrode 21 from directly contacting the active layer 23. The blocking layer 24 is interposed between the source electrode 22 and the drain electrode 21 and the active layer 23 to prevent a metal constituting the second layers 21b and 22b from diffusing toward the active layer 23 from side surfaces of the second layers 21b and 22b. The source electrode 22 and the drain electrode 21 may prevent a metal with low electric resistance from diffusing in vertical directions from the second layers 21b and 22b, which is formed of the metal with low electric resistance, by arranging the third layers 21c and 22c and the first layers 21a and 22a on and below the second layers 21b and 22b. However, if the active layer 23 contacts side surfaces of the second layers 21b and 22b, the metal with low electric resistance may be diffused to the active layer 23 from the side surfaces of the second layers 21b and 22b. Therefore, due to diffusion of the metal with low electric resistance, properties of TFT may be deteriorated, and the source electrode 22 and the drain electrode 21 may be short-circuited. According to an embodiment of the present embodiments, since the block layer 24 is interposed between the source electrode 22 and the drain electrode 21 and the active layer 23, it may prevent a metal with low electric resistance from being diffused to the active layer 23 from side surfaces of the source electrode 22 and the drain electrode 21. In some embodiments, the blocking layer 24 may be formed of a gallium oxide, an aluminum oxide, a titanium oxide, or a tungsten oxide.

In some embodiments, the active layer 23 may be arranged on the blocking layer 24. A source region (not shown) and a drain region (not shown) are respectively formed at two opposite ends of the active layer 23 and respectively correspond to the source electrode 22 and the drain electrode 21.

A first insulation layer 14, which is a gate insulation layer for insulation between the active layer 23 and the gate electrode 25, is formed on the buffer layer 11 to cover the active layer 23. The gate electrode 25 is formed on the first insulation layer 14 to correspond to the active layer 23. In some embodiments, the gate electrode 25 may be formed of a first layer 25a, a second layer 25b, and a third layer 25c that are formed on the first insulation layer 14 in the order stated. In some embodiments, the second layer 25b may be formed of a metal with low electric resistance, such as Al, Cu, or an Al alloy, where the Al alloy may be AlNd, AlNiLa, AlGeCoLa, AlNiGeLa, and the like. In some embodiments, the first layer 25a and the third layer 25c may be formed of Ti, Mo, TiN, TiSiN, TiAlN, and the like. In some embodiments, a second insulation layer 16 may be formed on the first insulation layer 14. In some embodiments, a third insulation layer 18 may be formed on the second insulation layer 16.

The storage region 3 includes a capacitor Cst. The capacitor Cst includes a bottom electrode 31 and a top electrode 35, where the first insulation layer 14 is interposed therebetween. In some embodiments, the bottom electrode 31 may be formed on a same layer as the source electrode 22 and the drain electrode 21 of the TFT. In some embodiments, the bottom electrode 31 can be formed on the buffer layer 11. The bottom electrode 31 includes a first bottom electrode 31a, a second bottom electrode 31b, and a third bottom electrode 31c, where the first bottom electrode 31a, the second bottom electrode 31b, and the third bottom electrode 31c are stack-formed on the buffer layer 11 in the order stated. In some embodiments, the first bottom electrode 31a, the second bottom electrode 31b, and the third bottom electrode 31c may be formed of the same materials as the first layers 21a and 22a, the second layers 21b and 22b, and the third layers 21c and 22c, respectively. In some embodiments, the top electrode 35 may be formed on a same layer as the gate electrode 25 of the TFT. In other words, the top electrode 35 may include a first top electrode 35a, a second top electrode 35b, and a third top electrode 35c that are formed on the first insulation layer 14 in the order stated. In some embodiments, the second top electrode 35b may be formed of a metal with low electric resistance, such as Al, Cu, or an Al alloy, where the Al alloy may be AlNd, AlNiLa, AlGeCoLa, AlNiGeLa, and the like. In some embodiments, the first top electrode 35a and the third top electrode 35c may be formed of Ti, Mo, TiN, TiSiN, TiAlN, and the like.

The emissive region 4 includes an organic emissive device EL. The organic emissive device EL includes a pixel electrode 41 that is connected to either the source electrode 22 or the drain electrode 21 of the TFT, a counter electrode 45 that is formed to face the pixel electrode 41, and an intermediate layer 43 which is interposed therebetween and includes an organic emissive layer.

According to an aspect of the present embodiments, the emissive region 4 includes the organic emissive device EL, and thus the structure shown in FIG. 1 may be used as a back plane for an organic light emitting display apparatus. However, the present embodiments are not limited thereto. For example, if liquid crystals are arranged between the pixel electrode 41 and the counter electrode 45, the structure shown in FIG. 1 may be used as a back plane for a liquid crystal display apparatus.

FIGS. 2 through 11 are schematic sectional views showing operations for manufacturing the back plane for a flat panel display apparatus shown in FIG. 1. Hereinafter, operations for manufacturing the back plane for a flat panel display apparatus shown in FIG. 1 will be briefly described.

Figure 2:
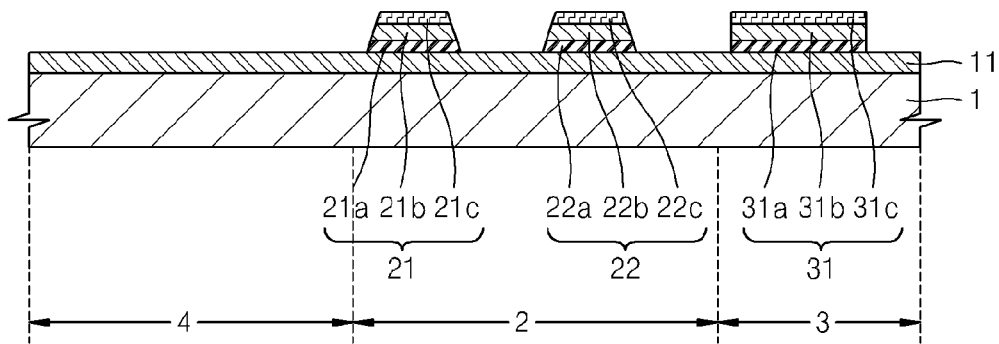
FIGS. 2 through 11 are schematic sectional views showing operations for manufacturing the back plane for a flat panel display apparatus shown in FIG. 1.

First, as shown in FIG. 2, the buffer layer 11 is formed on the substrate 1. In some embodiments, the substrate 1 may be a transparent SiO$_2$-based glass material. However, the present embodiments are not limited thereto, and the substrate 1 may be formed of any of various materials, such as a transparent plastic material, a metal, and the like.

In some embodiments, the buffer layer 11 may be formed on the substrate 1 to prevent diffusion of an impurity on the top surface of the substrate 1, prevent permeation of moisture or outer atmosphere, and to planarize the top surface of the substrate 1. In some embodiments, the buffer layer 11 may be formed of $SiO_2$ and/or $SiN_x$ by using any of various deposition methods, such as plasma enhanced chemical vapor deposition (PECVD), atmospheric pressure chemical vapor deposition (APCVD), low pressure chemical vapor deposition (LPCVD), and the like.

Next, the source electrode 22 and the drain electrode 21 of the TFT and the bottom electrode 31 of the capacitor Cst are formed on the buffer layer 11.

In detail, a first metal layer (not shown), a second metal layer (not shown), and a third metal layer (not shown) are formed on the buffer layer 11 in the order stated. In some embodiments, the first metal layer and the third metal layer may be formed of Ti, Mo, TiN, TiSiN, TiAlN, and the like, whereas the second metal layer may be formed of Al, Cu, AlNd, AlNiLa, AlGeCoLa, AlNiGeLa, and the like. In some embodiments, the first through third metal layers may be formed by using a method, such as sputtering, evaporation-deposition, e-beam deposition, or thermal deposition. After the first through third metal layers are formed, the first through third metal layers are patterned in a masking operation, and thus the source electrode 22, the drain electrode 21, and the bottom electrode 31 of the capacitor Cst are formed.

Figure 3:
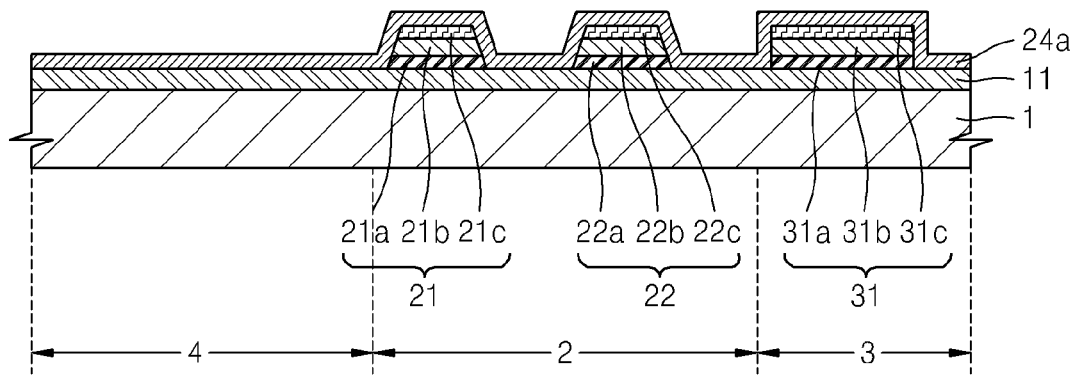

Next, referring to FIG. 3, a fourth metal layer 24a is formed on the buffer layer 11 to cover the source electrode 22, the drain electrode 21, and the bottom electrode 31 of the capacitor Cst. In some embodiments, the fourth metal layer 24a may be formed of gallium (Ga), aluminum (Al), titanium (Ti), or tungsten (W). In some embodiments, the fourth metal layer 24a may be formed by using a method, such as sputtering, evaporation-deposition, e-beam deposition, or thermal deposition.

Figure 4:
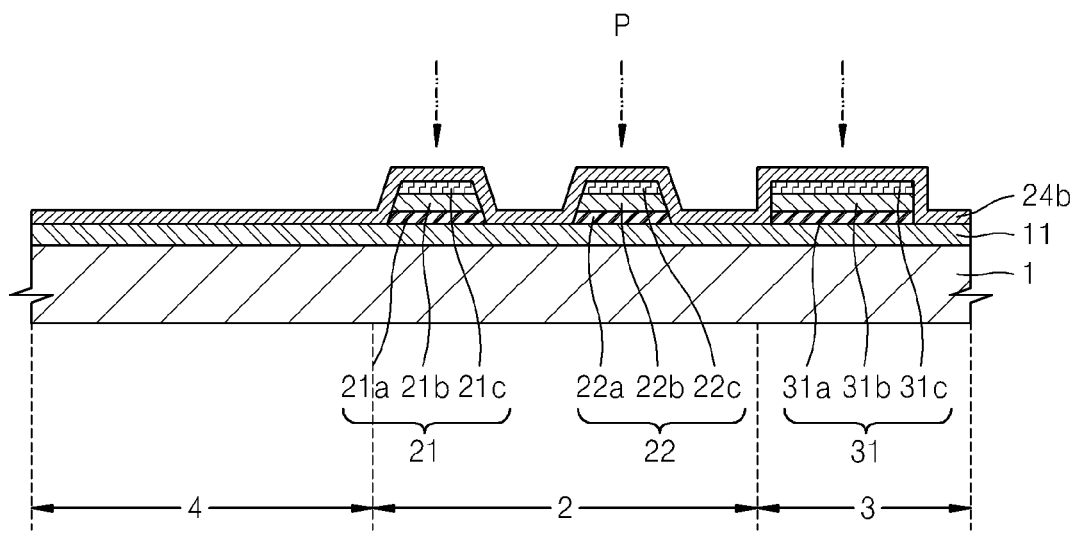

Next, referring to FIG. 4, a fifth metal layer 24b is formed by oxidizing the fourth metal layer 24a. In detail, the fifth metal layer 24b is formed by $O_2$-plasma processing the fourth metal layer 24a.

Figure 5:
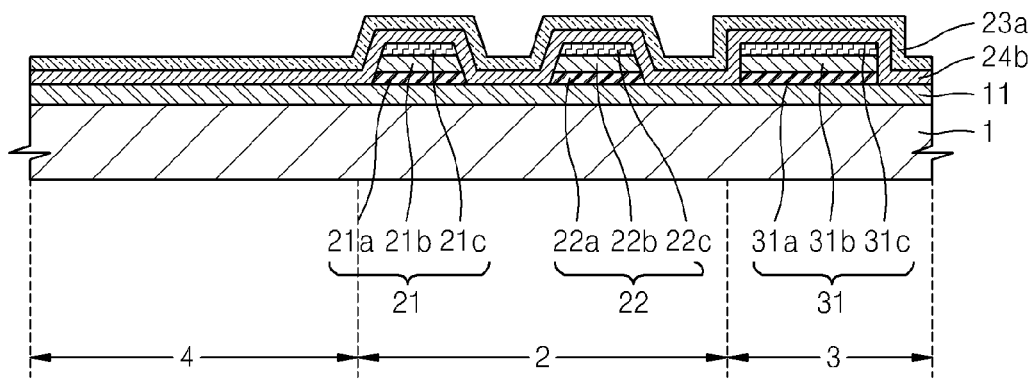

Next, referring to FIG. 5, an oxide semiconductor layer 23a is formed to cover the fifth metal layer 24b. The oxide semiconductor layer 23a may contain at least one material selected from the group consisting of indium (In), gallium (Ga), tin (Sn), zirconium (Zr), vanadium (V), hafnium (Hf), cadmium (Cd), germanium (Ge), and zinc (Zn). For example, the oxide semiconductor may contain Ga, In, and Zn in an atomic percent (atom %) ratio of 2:2:1. However, the present embodiments is not limited thereto, and the oxide semiconductor may be formed of one or more materials selected from among $InGaZnO$, $SnO_2$, $In_2O_3$, $ZnO$, $CdO$, $Cd_2SnO_4$, $TiO_2$, and $Ti_3N_4$.

Figure 6:
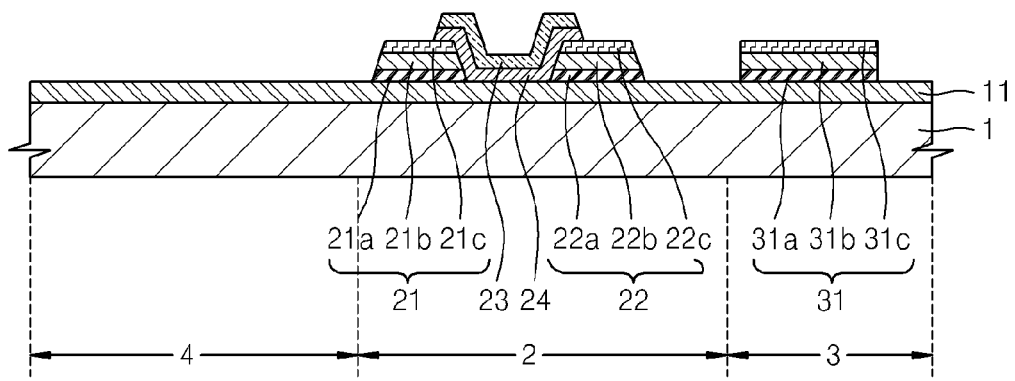

Next, referring to FIG. 6, the blocking layer 24 and the active layer 23 are formed by patterning the fifth metal layer 24b and the oxide semiconductor layer 23a in a masking operation. The active layer 23 is formed in correspondence to the source electrode 22 and the drain electrode 21, and the blocking layer 24 is arranged between the source electrode 22 and the drain electrode 21 and the active layer 23.

Two opposite ends of the active layer 23 constitute a source region (not shown) and a drain region (not shown), respectively, overlap on at least a portion of the top surface of the source electrode 22 and the drain electrode 21, and are electrically connected to the source electrode 22 and the drain electrode 21. As described above, the active layer 23 is formed of an oxide semiconductor.

According to an aspect of the present embodiments, an oxide semiconductor TFT features higher mobility as compared to conventional silicon (Si) TFT, and thus an additional ion doping for increasing mobility is not necessary. Furthermore, the oxide semiconductor TFT has polycrystalline and amorphous structure even in the room temperature. Therefore, no additional annealing operation is necessary, and thus the oxide semiconductor TFT may be manufactured in low-temperature operations. Furthermore, since an active layer may be formed by using a method such as sputtering, an oxide semiconductor TFT may be applied to a large-scale substrate, and source materials therefor are inexpensive.

Figure 7:
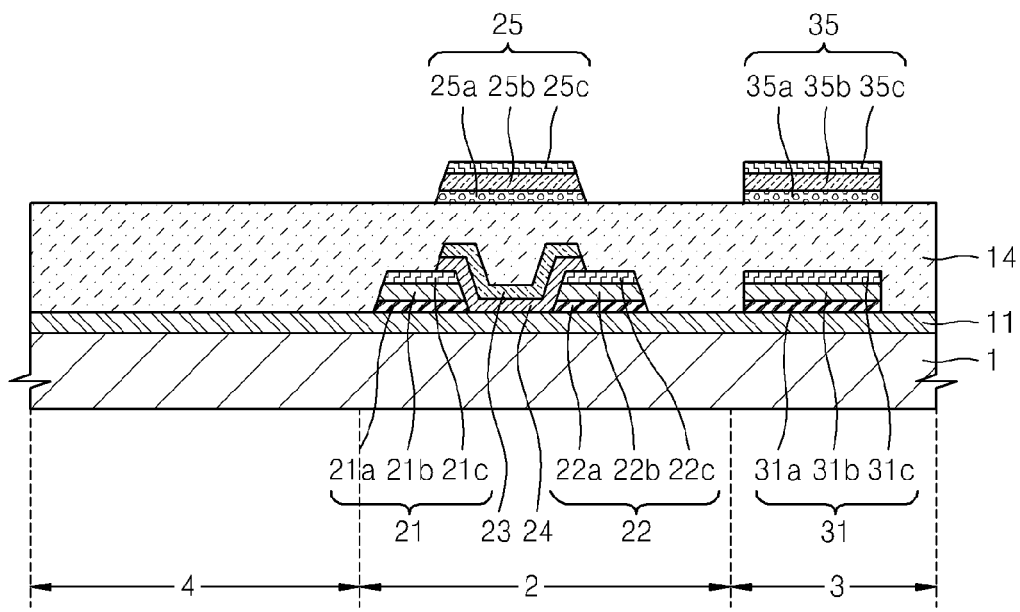

Next, referring to FIG. 7, the first insulation layer 14 is formed on the buffer layer 11 to cover the active layer 23.

In some embodiments, the first insulation layer 14 may be formed by depositing an inorganic insulation layer, such as a $SiN_x$ layer or a $SiO_x$ layer, by using a method, such as PECVD, APCVD, LPCVD, and the like. However, the present embodiments are not limited thereto, and the first insulation layer 14 may be an organic insulation layer or may have a stacked structure including an inorganic insulation layer and an organic insulation layer. The first insulation layer 14 is interposed between the active layer 23 and the gate electrode 25 of the TFT to function as a gate insulation layer of the TFT, and is interposed between the top electrode 35 and the bottom electrode 31 of the capacitor Cst to function as a dielectric layer of the capacitor Cst.

Next, the gate electrode 25 and the top electrode 35 of the capacitor Cst are formed on the first insulation layer 14.

In detail, the gate electrode 25 and the top electrode 35 of the capacitor Cst are patterned in a masking operation using a mask (not shown). In other words, a sixth metal layer (not shown), a seventh metal layer (not shown), and an eighth metal layer (not shown) are formed on the first insulation layer 14 in the order stated. Next, the gate electrode 25 including the first layer 25a, the second layer 25b, and the third layer 25c and the top electrode 35 of the capacitor Cst including the first top electrode 35a, the second top electrode 35b, and the third top electrode 35c are formed by patterning the sixth through eighth metal layers in a masking operation.

In some embodiments, the second layer 25b and the second top electrode 35b may be formed of a metal with low electric resistance, such as Al, Cu, or an Al alloy, where the Al alloy may be AlNd, AlNiLa, AlGeCoLa, AlNiGeLa, and the like. In some embodiments, the first layer 25a, the third layer 25c, the first top electrode 35a, and the third top electrode 35c may be formed of Ti, Mo, TiN, TiSiN, TiAlN, and the like.

In some embodiments, the gate electrode 25 can be formed to correspond to the active layer 23 of the transistor region 2, whereas the top electrode 35 is formed to correspond to the bottom electrode 31.

Figure 8:
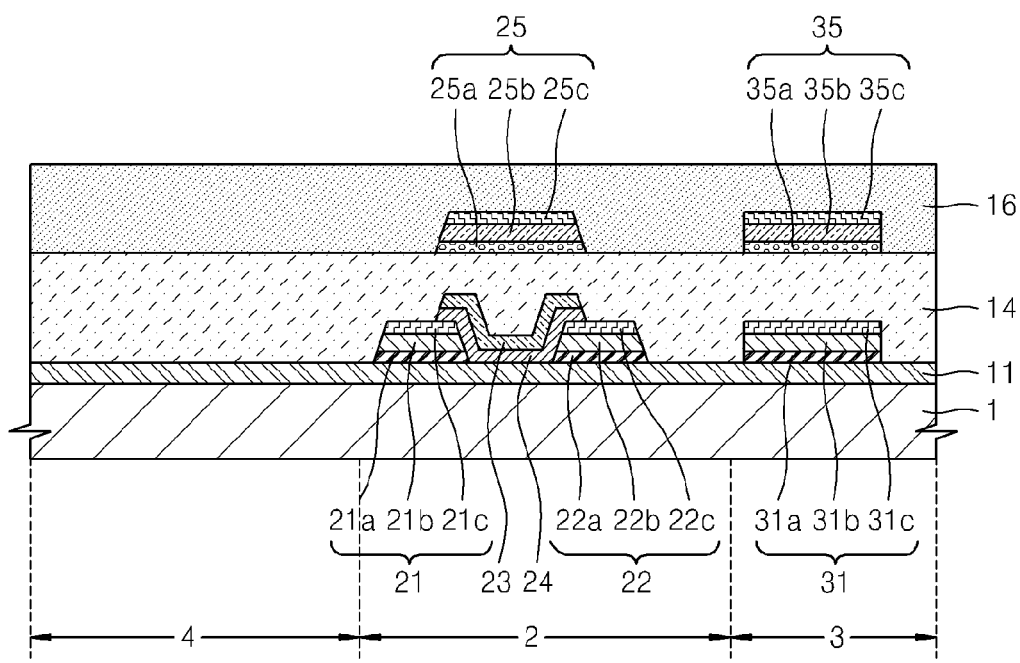

Next, referring to FIG. 8, a second insulation layer 16 is formed on the first insulation layer 14 to cover the gate electrode 25 and the top electrode 35.

In some embodiments, the second insulation layer 16 can be formed of one or more organic insulation materials selected from the group consisting of polyimide, polyamide, acrylic resins, benzocyclobuthane, and phenolic resins by using a method, such as spin coating. In some embodiments, the second insulation layer 16 may be formed of not only an organic material as described above, but also an inorganic material selected from among $SiO_2$, $SiN_x$, $Al_2O_3$, $CuO_x$, $Tb_4O_7$, $Y_2O_3$, $Nb_2O_5$, $Pr_2O_3$, and the like. In some embodiments, the second insulation layer 16 may have a multi-layer structure in which an organic insulation material and an inorganic insulation material are alternately stacked. The second insulation layer 16 is formed to have a sufficient thickness, e.g., a thickness greater than that of the first insulation layer 14, to function as a planarizing layer for planarizing the top surface on which the pixel electrode (41 of FIG. 1) is to be formed or play a role of a passivation layer for protecting the gate electrode 25 and the top electrode 35.

Figure 9:
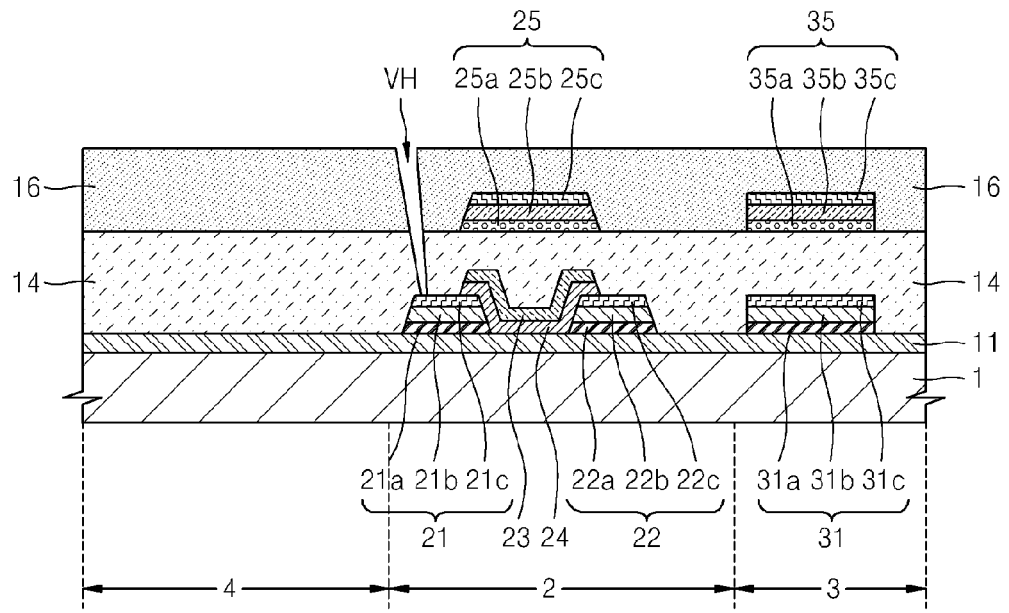

Next, referring to FIG. 9, a via hole VH which exposes the source electrode 22 or the drain electrode 21 is formed by patterning the first insulation layer 14 and the second insulation layer 16. Although the via hole VH can be formed to expose the drain electrode 21 as shown in FIG. 9, the present embodiments are not limited thereto.

In some embodiments, the via hole VH may be pattern-formed in a masking operation using a mask (not shown).

The via hole VH is formed to electrically interconnect the pixel electrode (41 of FIG. 1) and the TFT. Although the via hole VH is formed to expose the drain electrode 21, the present embodiments is not limited thereto. Furthermore, location and shape of the via hole VH are not limited to those shown in FIG. 9 and may vary.

Figure 10:
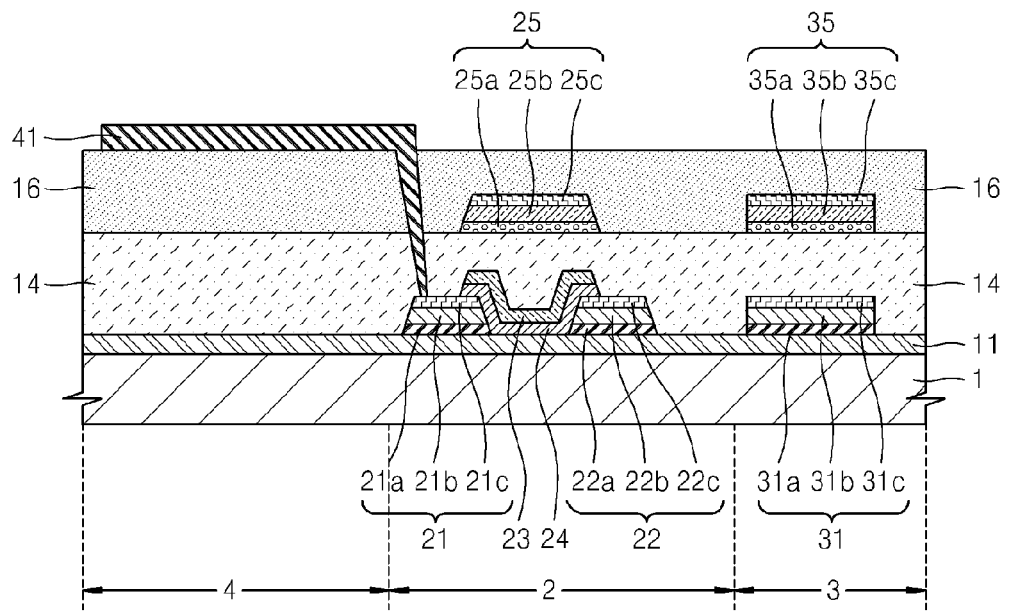

Next, referring to FIG. 10, the pixel electrode 41 which is electrically connected to the source electrode 22 or the drain electrode 21 is formed on the second insulation layer 16. Although the pixel electrode 41 can contact the drain electrode 21 as shown in FIG. 10, the present embodiments are not limited thereto.

In some embodiments, the pixel electrode 41 may be pattern-formed in a masking operation using a mask (not shown).

The pixel electrode 41 is connected to the emissive region 4 and is connected to either the source electrode 22 or the drain electrode 21 via the via hole VH. In some embodiments, the pixel electrode 41 may be formed of any of various materials according to type of an organic light emitting display apparatus. For example, in a case of a bottom-emission type organic light emitting display apparatus in which images are formed in a direction toward the substrate 1 or a dual-emission type organic light emitting display apparatus in which images are formed in both a direction toward the substrate 1 and an opposite direction, the pixel electrode 41 is formed of a transparent metal oxide. The pixel electrode 41 may contain one or more materials elected from among ITO (indium tin oxide), IZO (indium zinc oxide), ZnO (zinc oxide), and $In_2O_3$. In this case, as shown in FIG. 10, the emissive region 4 is designed to not to overlap the transistor region 2 and the storage region 3. Meanwhile, in a case of a top-emission type organic light emitting display apparatus in which images are formed in a direction away from the substrate 1, the pixel electrode 41 may further include a reflective electrode that is formed of a light-reflecting material. In some embodiments, the emissive region 4 may be designed to overlap the transistor region 2 and the storage region 3.

Figure 11:
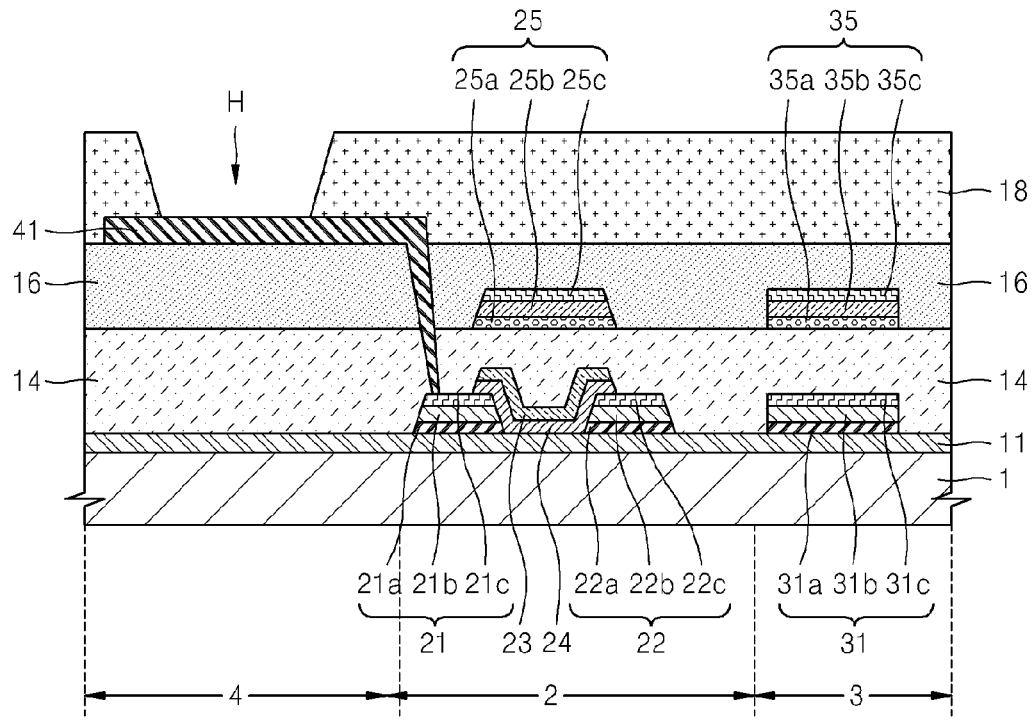

Next, as shown in FIG. 11, a third insulation layer 18 is formed on the pixel electrode 41, and an opening H which exposes the pixel electrode 41 is formed by patterning the third insulation layer 18.

In some embodiments, the opening H may be pattern-formed in a masking operation using a mask (not shown).

In some embodiments, the third insulation layer 18 can be formed of one or more organic insulation materials selected from the group consisting of polyimide, polyamide, acrylic resins, benzocyclobuthane, and phenolic resins by using a method, such as spin coating. Alternatively, the third insulation layer 18 may have a multi-layer structure in which an organic insulation material and an inorganic insulation material are alternately stacked. As the opening H is formed to expose the center portion of the pixel electrode 41, the third insulation layer 18 defines a pixel.

Finally, the intermediate layer 43, which includes an emissive layer, and the counter electrode 45 are formed in the opening H exposing the pixel electrode 41.

In some embodiments, the intermediate layer 43 may be formed as an emissive layer (EML), a hole injection layer (HIL), a hole transport layer (HTL), an electron transport layer (ETL), and an electron injection layer (EIL) are stacked in a single structure or a composite structure.

In some embodiments, the intermediate layer 43 may be formed of a monomer organic material or a polymer organic material.

In a case where the intermediate layer 43 is formed of a monomer organic material, the intermediate layer 43 is formed as the HTL and the HIL are stacked on the EML toward the pixel electrode 41 and the ETL and the EIL are stacked on the EML toward the counter electrode 45. Furthermore, any of various other layers may be stacked. In some embodiments, any of various organic materials including copper phthalocyanine (CuPc), N,N-di(naphthalene-1-yl)-N, N'-diphenyl-benzidine (NPB), tris-8-hyroxyquinoline aluminum (Alq3), or the like may be used.

In an embodiment where the intermediate layer 43 is formed of a polymer organic material, only the HTL may be stacked on the EML toward the pixel electrode 41. In some embodiments, the HTL may be formed of poly-(2,4)-ethylene-dihydroxy thiophene (PEDOT) or polyaniline (PANI) by using a method, such as inkjet printing or spin coating. In some embodiments, a polymer organic material, such as a poly-phenylenvinylene (PPV)-based polymer organic material or a polyfluorene-based polymer organic material, may be used, and a color pattern thereof may be formed by using a general method, such as inkjet printing, spin coating, or thermal transfer using a laser.

In some embodiments, the counter electrode 45 may be deposited onto the whole surface of the substrate 1 and formed as a common electrode. In case of an organic light emitting display apparatus according to the present embodiment, the pixel electrode 41 is used as an anode electrode, whereas the counter electrode 45 is used as a cathode electrode. In some embodiments, the polarities of the electrodes may be reversed.

In case of a bottom emission type organic light emitting display device, in which an image is emitted toward the substrate 1, the pixel electrode 41 becomes a transparent electrode, whereas the counter electrode 45 becomes a reflective electrode. In some embodiments, the reflective electrode may be formed by depositing a metal with a small work function, e.g., Ag, Mg, Al, Pt, Pd, Au, Ni, Nd, Ir, Cr, Li, Ca, LiF/Ca, LiF/Al, or a compound thereof, as a thin film.

Figure 12:
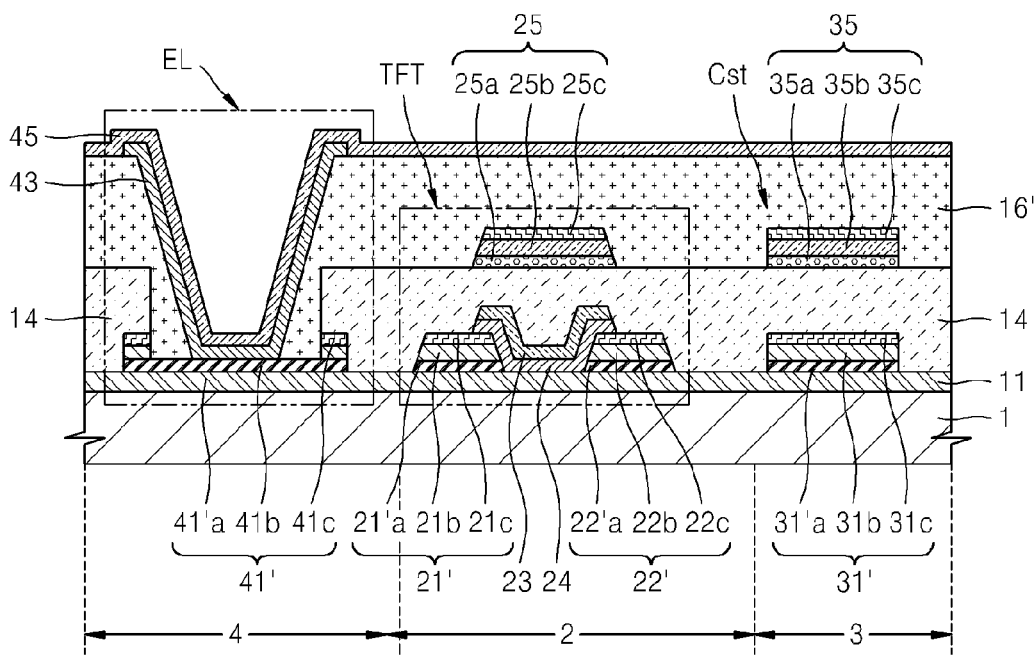
FIG. 12 is a schematic sectional view of a back plane for a flat panel display apparatus according to another aspect of the present embodiments.

FIG. 12 is a schematic sectional view of a back plane for a flat panel display apparatus according to another embodiment of the present embodiments.

Referring to FIG. 12, the back plane for a flat panel display apparatus includes the transistor region 2, the storage region 3, and the emissive region 4.

The transistor region 2 includes a thin-film transistor (TFT) as a driving device. The TFT includes the active layer 23, the blocking layer 24, the gate electrode 25, and source electrode 22' and the drain electrode 21'. The TFT according to the present embodiment may be a top-gate and bottom contact type TFT as described above with reference to FIG. 1, and the TFT may be an oxide semiconductor TFT.

In some embodiments, the source electrode 22' and the drain electrode 21' of the TFT may be formed on the buffer layer 11 that is formed on a substrate 1. In some embodiments, the source electrode 22' and the drain electrode 21' may include at least first layers 21a' and 22a', the second layers 21*b'* and 22*b*, and the third layers 21*c* and 22*c* that are stacked from the substrate 1 in the order stated. In some embodiments, the second layers 21*b* and 22*b* may be formed of a metal with low electric resistance. For example, the second layers 21*b* and 22*b* may be formed of aluminum (Al), copper (Cu), or an aluminum alloy. Examples of aluminum alloys may include AlNd, AlNiLa, AlGeCoLa, AlNiGeLa, and the like. In some embodiments, the third layers 21*c* and 22*c* and the first layers 21*a'* and 22*a'* may be arranged on and below the second layers 21*b* and 22*b*. In some embodiments, the first layers 21*a'* and 22*a'* may be formed of a transparent conductive material. For example, the first layers 21*a'* and 22*a'* may be formed of ITO, IZO, ZnO, or $In_2O_3$. In some embodiments, the third layers 21*c* and 22*c* may function as a capping layer for preventing hillock. In some embodiments, the third layers 21*c* and 22*c* may be formed of Ti, Mo, TiN, TiSiN, TiAlN, and the like.

The blocking layer 24 and the active layer 23 are formed on the source electrode 22' and the drain electrode 21'. In other words, the blocking layer 24 is interposed between the source electrode 22' and the drain electrode 21' and the active layer 23 to prevent the source electrode 22' and the drain electrode 21' from directly contacting the active layer 23. The blocking layer 24 is interposed between the source electrode 22' and the drain electrode 21' and the active layer 23 to prevent a metal constituting the second layers 21*b* and 22*b* from diffusing toward the active layer 23 from side surfaces of the second layers 21*b* and 22*b*. The source electrode 22' and the drain electrode 21' may prevent a metal with low electric resistance from diffusing in vertical directions from the second layers 21*b* and 22*b*, which is formed of the metal with low electric resistance, by arranging the third layers 21*c* and 22*c* and the first layers 21*a* and 22*a* on and below the second layers 21*b* and 22*b*. In some embodiments, the metal with low electric resistance may be diffused to the active layer 23 from the side surfaces of the second layers 21*b* and 22*b* if the active layer 23 contacts side surfaces of the second layers 21*b* and 22*b*. Therefore, due to diffusion of the metal with low electric resistance, properties of TFT may be deteriorated, and the source electrode 22' and the drain electrode 21' may be short-circuited. According to an aspect of the present embodiments, since the block layer 24 is interposed between the source electrode 22' and the drain electrode 21' and the active layer 23, it may prevent a metal with low electric resistance from being diffused to the active layer 23 from side surfaces of the source electrode 22' and the drain electrode 21'. In some embodiments, the blocking layer 24 may be formed of a gallium oxide, an aluminum oxide, a titanium oxide, or a tungsten oxide.

In some embodiments, the active layer 23 may be arranged on the blocking layer 24. A source region (not shown) and a drain region (not shown) are respectively formed at two opposite ends of the active layer 23 and respectively correspond to the source electrode 22' and the drain electrode 21'.

The first insulation layer 14, which is a gate insulation layer for insulation between the active layer 23 and the gate electrode 25, is formed on the buffer layer 11 to cover the active layer 23. The gate electrode 25 is formed on the first insulation layer 14 to correspond to the active layer 23. In some embodiments, the gate electrode 25 may be formed of the first layer 25*a*, the second layer 25*b*, and the third layer 25*c* that are formed on the first insulation layer 14 in the order stated. In some embodiments, the second layer 25*b* may be formed of a metal with low electric resistance, such as Al, Cu, or an Al alloy, where the Al alloy may be AlNd, AlNiLa, AlGeCoLa, AlNiGeLa, and the like. In some embodiments, the first layer 25*a* and the third layer 25*c* may be formed of Ti, Mo, TiN, TiSiN, TiAlN, and the like.

The storage region 3 includes a capacitor Cst. The capacitor Cst includes a bottom electrode 31' and the top electrode 35, where the first insulation layer 14 is interposed therebetween. In some embodiments, the bottom electrode 31' may be formed on a same layer as the source electrode 22' and the drain electrode 21' of the TFT. In other words, the bottom electrode 31' is formed on the buffer layer 11. The bottom electrode 31' includes a first bottom electrode 31*a'*, the second bottom electrode 31*b*, and the third bottom electrode 31*c*, where the first bottom electrode 31*a'*, the second bottom electrode 31*b*, and the third bottom electrode 31*c* are stack-formed on the buffer layer 11 in the order stated. In some embodiments, the first bottom electrode 31*a'*, the second bottom electrode 31*b*, and the third bottom electrode 31*c* may be formed of the same materials as the first layers 21*a'* and 22*a'*, the second layers 21*b* and 22*b*, and the third layers 21*c* and 22*c*, respectively. In some embodiments, the top electrode 35 may be formed on a same layer as the gate electrode 25 of the TFT. In some embodiments, the top electrode 35 may include the first top electrode 35*a*, the second top electrode 35*b*, and the third top electrode 35*c* that are formed on the first insulation layer 14 in the order stated. In some embodiments, the second top electrode 35*b* may be formed of a metal with low electric resistance, such as Al, Cu, or an Al alloy, where the Al alloy may be AlNd, AlNiLa, AlGeCoLa, AlNiGeLa, and the like. In some embodiments, the first top electrode 35*a* and the third top electrode 35*c* may be formed of Ti, Mo, TiN, TiSiN, TiAlN, and the like.

The emissive region 4 includes the organic emissive device EL. The organic emissive device EL includes a pixel electrode 41' that is connected to either the source electrode 22' or the drain electrode 21' of the TFT, the counter electrode 45 that is formed to face the pixel electrode 41', and the intermediate layer 43 which is interposed therebetween and includes an organic emissive layer. In some embodiments, the pixel electrode 41' is formed of a transparent conductive material and may be formed on a same layer using a same material as the first layers 21*a'* and 22*a'* of the source/drain electrodes 22' and 21'.

Unlike the back plane for a flat panel display apparatus shown in FIG. 1, the bottom electrode 31' includes the first layers 21*a'*, 22*a'* and 31*a'* containing a transparent conductive material which also constitutes the pixel electrode 41', in the back plane for a flat panel display apparatus shown in FIG. 12. Due to the coplanar structure, the back plane for a flat panel display apparatus shown in FIG. 12 may be manufactured with a smaller number of operations as compared to the back plane for a flat panel display apparatus shown in FIG. 1.

FIGS. 13 through 21 are schematic sectional views showing operations for manufacturing the back plane for a flat panel display apparatus shown in FIG. 12.

Figure 13:
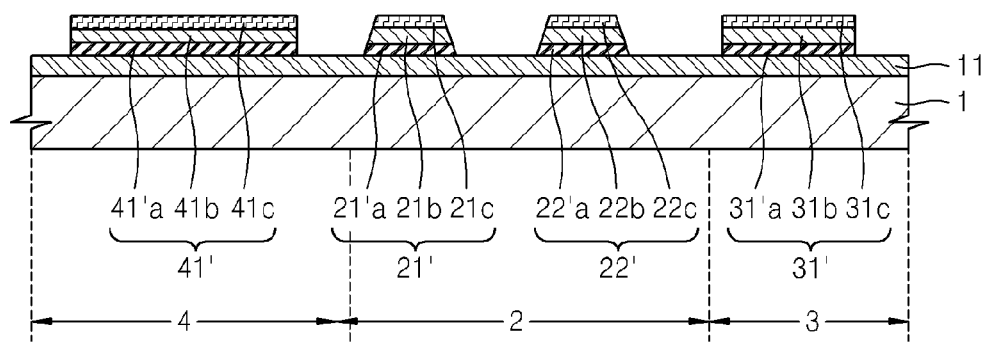
FIGS. 13 through 21 are schematic sectional views showing operations for manufacturing the back plane for a flat panel display apparatus shown in FIG. 12.

First, as shown in FIG. 13, the buffer layer 11 is formed on the substrate 1. In some embodiments, the substrate 1 may be a transparent $SiO_2$-based glass material. However, the present embodiments are not limited thereto, and the substrate 1 may be formed of any of various materials, such as a transparent plastic material, a metal, and the like.

In some embodiments, the buffer layer 11 may be formed on the substrate 1 to prevent diffusion of an impurity on the top surface of the substrate 1, prevent permeation of moisture or outer atmosphere, and to planarize the top surface of the substrate 1. In some embodiments, the buffer layer 11 may be formed of $SiO_2$ and/or $SiN_x$ by using any of various deposition methods, such as plasma enhanced chemical vapor deposition (PECVD), atmospheric pressure chemical vapor deposition (APCVD), low pressure chemical vapor deposition (LPCVD), and the like.

Next, the pixel electrode 41', the source electrode 22' and the drain electrode 21' of the TFT, and the bottom electrode 31' of the capacitor Cst are formed on the buffer layer 11.

In detail, a first metal layer (not shown), a second metal layer (not shown), and a third metal layer (not shown) are formed on the buffer layer 11 in the order stated. In some embodiments, the first metal layer may be formed of a transparent conductive material, such as ITO, IZO, ZnO, or $In_2O_3$. In some embodiments, the third metal layer may be formed of Ti, Mo, TiN, TiSiN, TiAlN, and the like, whereas the second metal layer may be formed of Al, Cu, AlNd, AlNiLa, AlGeCoLa, AlNiGeLa, and the like. In some embodiments, the first through third metal layers may be formed by using a method, such as sputtering, evaporation-deposition, e-beam deposition, or thermal deposition. After the first through third metal layers are formed, the first through third metal layers are patterned in a masking operation, and thus the pixel electrode 41', the source electrode 22', the drain electrode 21', and the bottom electrode 31' of the capacitor Cst are formed.

Figure 14:
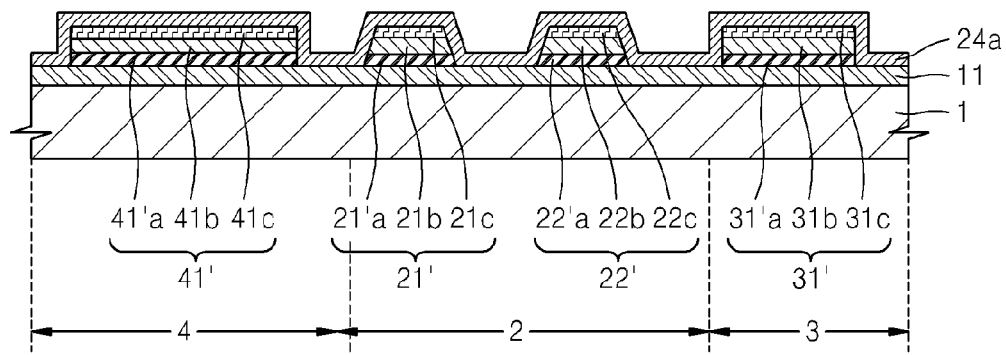

Next, referring to FIG. 14, the fourth metal layer 24a is formed on the buffer layer 11 to cover the pixel electrode 41', the source electrode 22', the drain electrode 21', and the bottom electrode 31' of the capacitor Cst. In some embodiments, the fourth metal layer 24a may be formed of gallium (Ga), aluminum (Al), titanium (Ti), or tungsten (W). In some embodiments, the fourth metal layer 24a may be formed by using a method, such as sputtering, evaporation-deposition, e-beam deposition, or thermal deposition.

Figure 15:
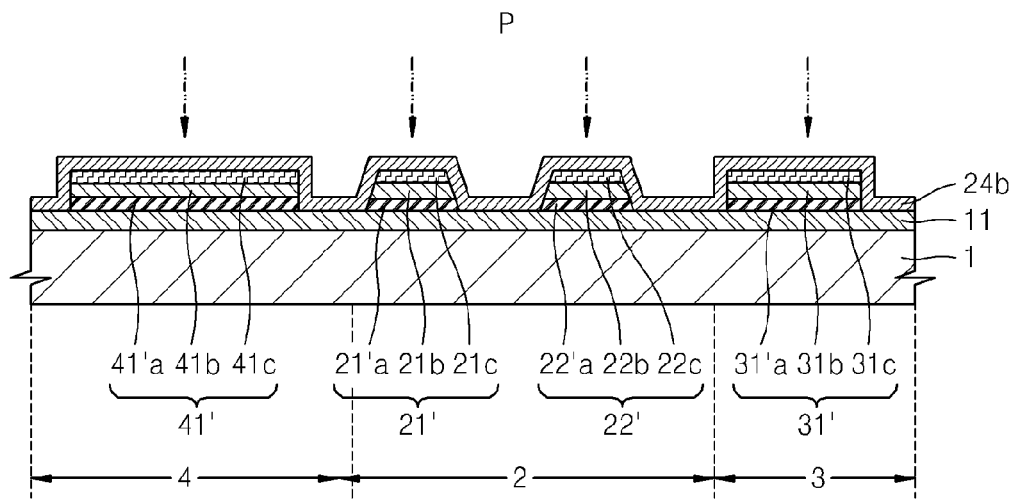

Next, referring to FIG. 15, the fifth metal layer 24b is formed by oxidizing the fourth metal layer 24a. In detail, the fifth metal layer 24b is formed by $O_2$-plasma processing the fourth metal layer 24a.

Figure 16:
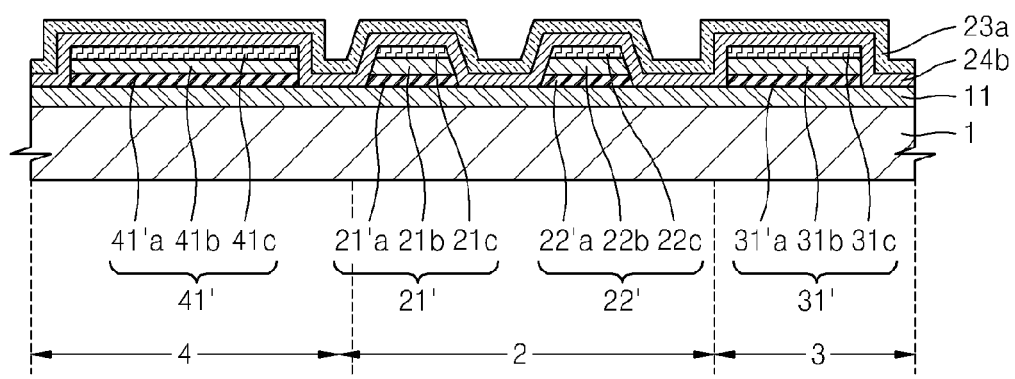

Next, referring to FIG. 16, the oxide semiconductor layer 23a is formed to cover the fifth metal layer 24b. The oxide semiconductor layer 23a may contain at least one material selected from the group consisting of indium (In), gallium (Ga), tin (Sn), zirconium (Zr), vanadium (V), hafnium (Hf), cadmium (Cd), germanium (Ge), and zinc (Zn). For example, the oxide semiconductor may contain Ga, In, and Zn in an atomic percent (atom %) ratio of 2:2:1. However, the present embodiments are not limited thereto, and the oxide semiconductor may be formed of one or more materials selected from among InGaZnO, $SnO_2$, $In_2O_3$, ZnO, CdO, $Cd_2SnO_4$, $TiO_2$, and $Ti_3N_4$.

Figure 17:
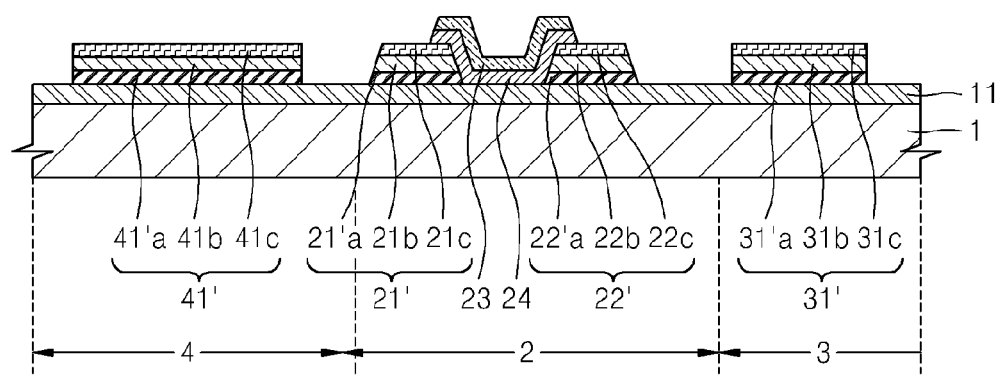

Next, referring to FIG. 17, the blocking layer 24 and the active layer 23 are formed by patterning the fifth metal layer 24b and the oxide semiconductor layer 23a in a masking operation. The active layer 23 is formed in correspondence to the source electrode 22' and the drain electrode 21', and the blocking layer 24 is arranged between the source electrode 22' and the drain electrode 21' and the active layer 23.

Two opposite ends of the active layer 23 constitute a source region (not shown) and a drain region (not shown), respectively, overlap on at least a portion of the top surface of the source electrode 22' and the drain electrode 21', and are electrically connected to the source electrode 22' and the drain electrode 21'. As described above, the active layer 23 is formed of an oxide semiconductor.

Figure 18:
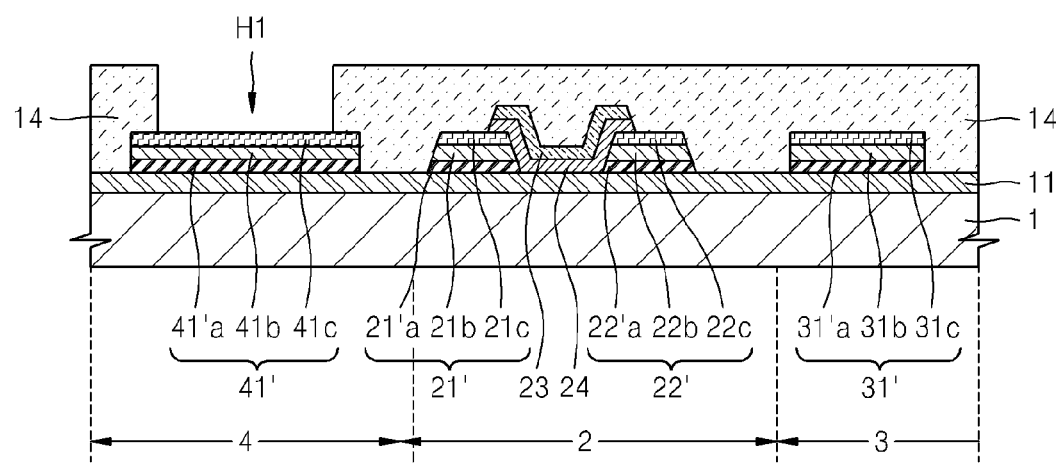

Next, referring to FIG. 18, a first opening H1 which exposes at least a portion of the pixel electrode 41' by forming the first insulation layer 14 on the substrate 1 on which the active layer 23 is formed and patterning the first insulation layer 14.

In some embodiments, the first insulation layer 14 may be formed by depositing an inorganic insulation layer, such as a $SiN_x$ layer or a $SiO_x$ layer, by using a method, such as PECVD, APCVD, LPCVD, and the like. However, the present embodiments are not limited thereto, and the first insulation layer 14 may be an organic insulation layer or may have a stacked structure including an inorganic insulation layer and an organic insulation layer. The first insulation layer 14 is interposed between the active layer 23 and the gate electrode 25 of the TFT to function as a gate insulation layer of the TFT, and is interposed between the top electrode 35 and the bottom electrode 31 of the capacitor Cst to function as a dielectric layer of the capacitor Cst.

In some embodiments, the first opening H1 may be formed by patterning the first insulation layer 14 in a masking operation using a mask (not shown).

Here, the first opening H1 is formed in the emissive region 4 and exposes at least a portion of the top surface of a third conductive layer 41c of the pixel electrode 41'. Although the first opening H1 may be formed to expose a portion of the top surface of the third conductive layer 41c or to expose the entire pixel electrode 41', the present embodiments are not limited thereto.

Figure 19:
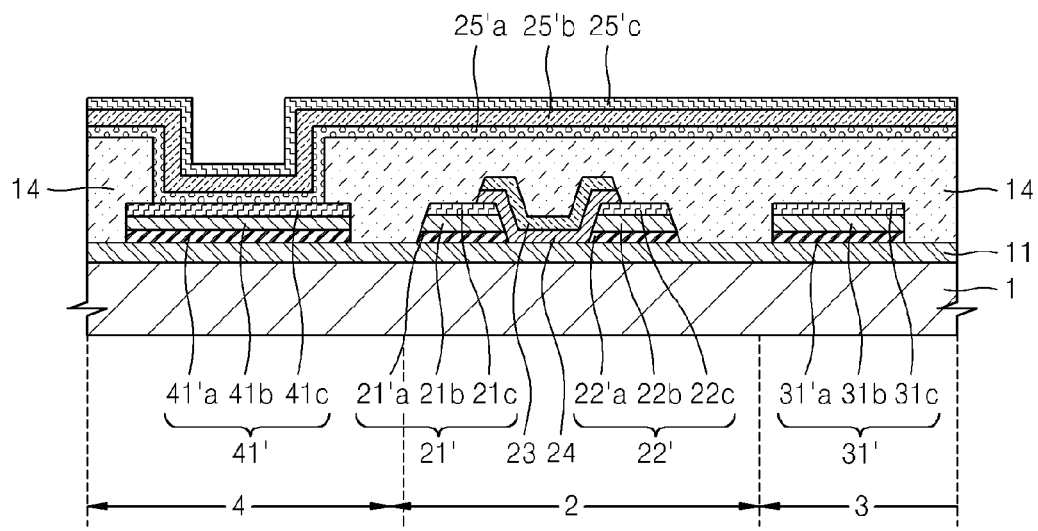

Next, as shown in FIG. 19, a sixth metal layer 25a', a seventh metal layer 25b', and an eighth metal layer 25c' are formed on the substrate 1 to cover the first insulation layer 14 in the order stated. In some embodiments, the seventh metal layer 25b' may be formed of a metal with low electric resistance, such as Al, Cu, or an Al alloy, where the Al alloy may be AlNd, AlNiLa, AlGeCoLa, AlNiGeLa, and the like. The sixth metal layer 25a' and the eighth metal layer 25c' may be formed of Ti, Mo, TiN, TiSiN, TiAlN, and the like.

Figure 20:
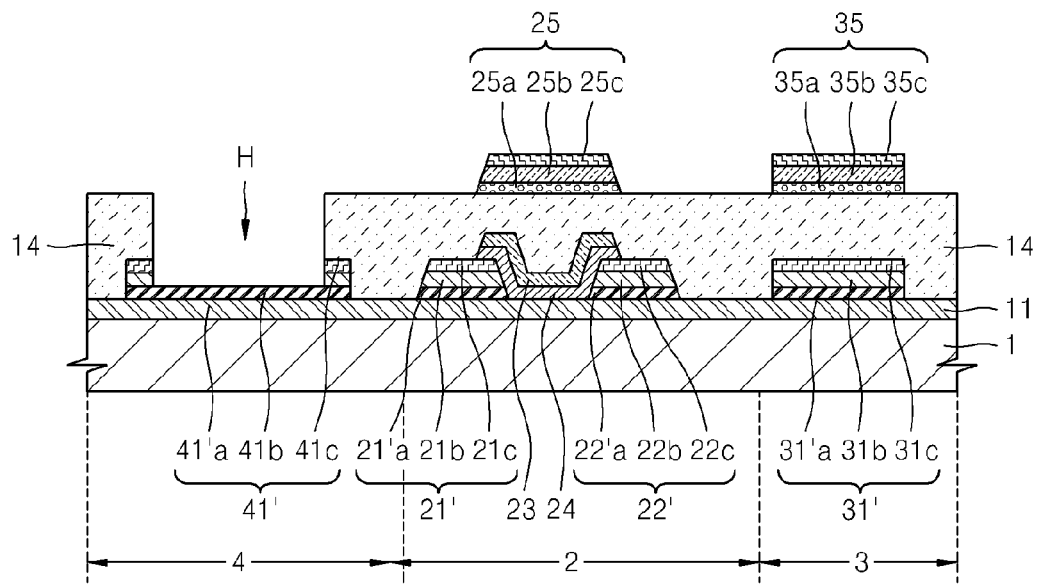

Next, as shown in FIG. 20, the gate electrode 25 including metal layer 25a, metal layer 25b, and metal layer 25c and the top electrode 35 including metal layer 35a, metal layer 35b, and metal layer 35c of the capacitor Cst are formed by patterning the sixth metal layer 25a', the seventh metal layer 25b', and the eighth metal layer 25c'.

In some embodiments, the gate electrode 25 and the top electrode 35 of the capacitor Cst may be patterned in a masking operation using a mask (not shown).

At the same time, the opening H is formed in the pixel electrode 41'. In detail, the opening H which exposes a first conductive layer 41a' of the pixel electrode 41' is formed by removing at least portions of a second conductive layer 41b and the third conductive layer 41c of the pixel electrode 41'. Therefore, at least the center portion of the first conductive layer 41a' containing a transparent conductive material is exposed.

Figure 21:
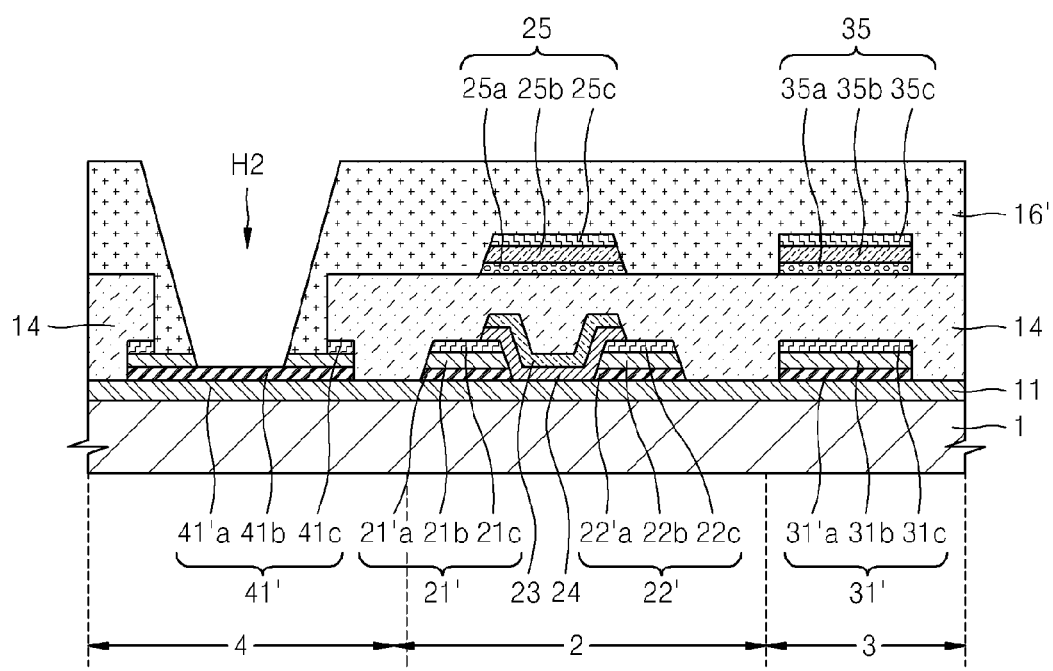

Next, as shown in FIG. 21, after the second insulation layer 16 is formed to cover the gate electrode 25, the top electrode 35, and the pixel electrode 41', a second opening H2 which exposes the pixel electrode 41' is patterned, and thus a pixel defining layer is formed.

In some embodiments, the second insulation layer 16 is formed on the substrate 1, on which the pixel electrode 41', the gate electrode 25, and the top electrode 35 are formed, to have a sufficient thickness. In some embodiments, the second insulation layer 16 may be formed of one or more organic insulation materials selected from the group consisting of polyimide, polyamide, acrylic resins, benzocyclobuthane, and phenolic resins by using a method, such as spin coating. In some embodiments, the second insulation layer 16 may be formed of not only an organic material as described above, but also an inorganic material selected from among $SiO_2$, $SiN_x$, $Al_2O_3$, $CuO_x$, $Tb_4O_7$, $Y_2O_3$, $Nb_2O_5$, $Pr_2O_3$, and the like. Alternatively, the second insulation layer 16 may have a multi-layer structure in which an organic insulation material and an inorganic insulation material are alternately stacked.

The pixel defining layer is formed by forming the second opening H2 to expose the center portion of the pixel electrode 41' by patterning the second insulation layer 16 in a masking operation using a mask (not shown), and thus the pixel defining layer defines a pixel.

Finally, the intermediate layer (43 of FIG. 12) including an emissive layer is formed in the second opening H2 exposing the pixel electrode 41'.

In some embodiments, the stacked layers may be removed via dry-etching or wet-etching during any of the masking operations described above.

Furthermore, although only one TFT and only one capacitor are shown in each of the attached drawings for convenience of explanation, the present embodiments are not limited thereto, and a plurality of TFTs and a plurality of capacitors may be employed as long as a number of making operations is not increased.

Although exemplary embodiments have been described for illustrative purposes, those skilled in the art will appreciate that various modifications, additions and substitutions are possible without departing from the spirit and scope of the present embodiments as defined by the following claims.

What is claimed is:

1. A back plane for a flat panel display apparatus, the back plane comprising:
   a substrate;
   a source electrode and a drain electrode formed on the substrate, each of the source electrode and the drain electrode having a side surface and a top surface;
   a capacitor bottom electrode formed on a same layer as the source/drain electrodes;
   an active layer formed on the substrate in correspondence to the source electrode and the drain electrode;
   a blocking layer interposed between the source electrode and the active layer and between the drain electrode and the active layer, the blocking layer contacting the side surface of the source electrode and the side surface of the drain electrode;
   a first insulation layer formed on the substrate to cover the active layer and continuously extended to cover the capacitor bottom electrode;
   a gate electrode formed on the first insulation layer in correspondence to the active layer;
   a capacitor top electrode formed on a same layer as the gate electrode in correspondence to the capacitor bottom electrode; and
   a second insulation layer formed on the first insulation layer to cover the gate electrode and the capacitor top electrode.

2. The back plane for a flat panel display apparatus of claim 1, further comprising a buffer layer interposed between the substrate and the source electrode and the drain electrode.

3. The back plane for a flat panel display apparatus of claim 1, wherein the active layer contains an oxide semiconductor.

4. The back plane for a flat panel display apparatus of claim 3, wherein the active layer contains at least one material selected from the group consisting of indium (In), gallium (Ga), tin (Sn), zirconium (Zr), vanadium (V), hafnium (Hf), cadmium (Cd), germanium (Ge), and zinc (Zn).

5. The back plane for a flat panel display apparatus of claim 1, wherein
   the source electrode and the drain electrode comprise first layers, second layers, and third layers that are formed on the substrate, and
   the second layers are formed of a metal with less electric resistance as compared to the first and third layers.

6. The back plane for a flat panel display apparatus of claim 5, wherein the second layers are formed of aluminum (Al), or copper (Cu).

7. The back plane for a flat panel display apparatus of claim 5, wherein the blocking layer prevents a metal constituting the second layers from diffusing toward the active layer and the first insulation layer directly contacts a portion of the substrate, a portion of the top of the source electrode, a portion of the top of the drain electrode and a portion of the active layer.

8. The back plane for a flat panel display apparatus of claim 1, wherein the active layer overlaps at least portions of the top surfaces of the source electrode and the drain electrode.

9. The back plane for a flat panel display apparatus of claim 1, wherein the blocking layer is interposed between the source electrode and the drain electrode and the active layer to prevent the active layer from directly contacting the source electrode and the drain electrode.

10. The back plane for a flat panel display apparatus of claim 1, wherein the blocking layer is formed of a titanium oxide or a tungsten oxide.

11. A flat panel display apparatus comprising:
    the back plane for a flat panel display apparatus of claim 1;
    a pixel electrode which is formed on the second insulation layer and is electrically connected to the source electrode or the drain electrode;
    an intermediate layer which is formed on the pixel electrode and comprises an emissive layer; and
    a counter electrode which is formed to face the pixel electrode across the intermediate layer.

12. The flat panel display apparatus of claim 11, further comprising a third insulation layer which is formed on the second insulation layer to cover end portions of the pixel electrode and comprises an opening for exposing at least a portion of the pixel electrode.

13. A flat panel display apparatus comprising:
    the back plane for a flat panel display apparatus of claim 1;
    a pixel electrode which is formed on the substrate on a same layer as the source electrode and the drain electrode and is electrically connected to the source electrode or the drain electrode;
    an intermediate layer which is formed on the pixel electrode and comprises an emissive layer; and
    a counter electrode which is formed to face the pixel electrode across the intermediate layer.

14. The flat panel display apparatus of claim 13, wherein
    the first insulation layer comprises a first opening which exposes at least a portion of the pixel electrode, and
    the second insulation layer comprises a second opening which is formed adjacent to the first opening or inside the first opening to expose at least a portion of the pixel electrode.

15. The flat panel display apparatus of claim 13, wherein
    the source electrode and the drain electrode comprise first layers, second layers, and third layers that are formed on the substrate,
    the first layers contain a metal oxide,
    the second layers are formed of a metal with less electric resistance as compared to the first and third layers,
    the pixel electrode comprises a first conductive layer, a second conductive layer, and a third conductive layer that are formed on the substrate in the order stated,
    the first conductive layer contains a metal oxide, and
    the second and third conductive layers comprise openings for exposing the first conductive layer.

16. The flat panel display apparatus of claim 15, wherein the second layers are formed of aluminum (Al), copper (Cu), or an aluminum alloy.

17. The flat panel display apparatus of claim 13, wherein the counter electrode reflects light emitted by the emissive layer.

* * * * *